United States Patent
Singhal et al.

(10) Patent No.: US 11,249,876 B2
(45) Date of Patent: Feb. 15, 2022

(54) SYSTEM AND METHOD FOR PREDICTING APPLICATION PERFORMANCE FOR LARGE DATA SIZE ON BIG DATA CLUSTER

(71) Applicant: Tata Consultancy Services Limited, Mumbai (IN)

(72) Inventors: Rekha Singhal, Mumbai (IN); Praveen Kumar Singh, Mumbai (IN)

(73) Assignee: Tata Consultancy Services Limited, Mumbai (IN)

( * ) Notice: Subject to any disclaimer, the term of this patent is extended or adjusted under 35 U.S.C. 154(b) by 632 days.

(21) Appl. No.: 16/107,425

(22) Filed: Aug. 21, 2018

(65) Prior Publication Data
US 2019/0065336 A1 Feb. 28, 2019

(30) Foreign Application Priority Data
Aug. 24, 2017 (IN) .............................. 201721030094

(51) Int. Cl.
*G06F 11/34* (2006.01)
*G06F 9/455* (2018.01)
(Continued)

(52) U.S. Cl.
CPC ...... *G06F 11/3409* (2013.01); *G06F 9/45504* (2013.01); *G06F 9/5061* (2013.01);
(Continued)

(58) Field of Classification Search
CPC .............. G06F 11/3409; G06F 11/302; G06F 11/3452; G06F 30/20; G06F 9/45504; G06F 9/5061
See application file for complete search history.

(56) References Cited

U.S. PATENT DOCUMENTS

2014/0026147 A1* 1/2014 Cherkasova ............ G06F 9/505
  718/105
2014/0358977 A1* 12/2014 Cramer ................. G06F 16/183
  707/827
(Continued)

FOREIGN PATENT DOCUMENTS

CN 105868019 A * 8/2016 ............... G06F 9/50
EP 3179387 6/2017
(Continued)

OTHER PUBLICATIONS

Singhal, Rekha, and Abhishek Verma. "Predicting job completion time in heterogeneous mapreduce environments." 2016 IEEE International Parallel and Distributed Processing Symposium Workshops (IPDPSW). IEEE, 2016. (Year: 2016).*
(Continued)

*Primary Examiner* — Boris Gorney
*Assistant Examiner* — Joshua E. Jensen
(74) *Attorney, Agent, or Firm* — Finnegan, Henderson, Farabow, Garrett & Dunner LLP (57) ABSTRACT

A system and method for estimating execution time of an application with Spark™ platform in a production environment. The application on Spark™ platform is executed as a sequence of Spark jobs. Each Spark job is executed as a directed acyclic graph (DAG) consisting of stages. Each stage has multiple executors running in parallel and the each executor has set of concurrent tasks. Each executor spawns multiple threads, one for each task. All jobs in the same executor share the same JVM memory. The execution time for each Spark job is predicted as summation of the estimated execution time of all its stages. The execution time constitutes scheduler delay, serialization time, de-serialization time, and JVM overheads. The JVM time estimation
(Continued)

depends on type of computation hardware system and number of threads.

5 Claims, 7 Drawing Sheets

(51) Int. Cl.
*G06F 11/30* (2006.01)
*G06F 9/50* (2006.01)
*G06F 30/20* (2020.01)

(52) U.S. Cl.
CPC ........ *G06F 11/302* (2013.01); *G06F 11/3452* (2013.01); *G06F 30/20* (2020.01); *G06F 2209/5019* (2013.01)

(56) References Cited

U.S. PATENT DOCUMENTS

| | | | |
|---|---|---|---|
| 2015/0264122 A1* | 9/2015 | Shau | G06F 9/5088 |
| | | | 709/203 |
| 2016/0021173 A1 | 1/2016 | Tapia | |
| 2017/0083384 A1 | 3/2017 | Stocker et al. | |
| 2017/0315848 A1* | 11/2017 | Kung | G06F 9/5055 |
| 2018/0300174 A1* | 10/2018 | Karanasos | G06F 9/4881 |

FOREIGN PATENT DOCUMENTS

| | | |
|---|---|---|
| EP | 3180695 | 6/2017 |
| WO | WO-2016/025924 | 2/2016 |

OTHER PUBLICATIONS

Tan, Yu Shyang, et al. "Hadoop framework: impact of data organization on performance." Software: Practice and Experience 43.11 (2013): 1241-1260. (Year: 2013).*

\* cited by examiner

SYSTEM AND METHOD FOR PREDICTING APPLICATION PERFORMANCE FOR LARGE DATA SIZE ON BIG DATA CLUSTER

PRIORITY CLAIM

This U.S. patent application claims priority under 35 U.S.C. § 119 to India Application No. 201721030094, filed on Aug. 24, 2017. The entire contents of the abovementioned application are incorporated herein by reference.

TECHNICAL FIELD

The embodiments herein generally relates to a system and method for predicting performance of an application on a big data platform for large data size and, more particularly, predicting performance of the application on Spark™ platform for large data and cluster size with different configurations.

BACKGROUND

The digitization wave has led to challenge of processing high volume and high velocity data in real time. The wide availability of the open source big data processing frameworks, such as Spark™, has increased migration of existing applications and deployment of new applications to these cost-effective platforms. The Spark™ is one of the commodity cluster platform available in open source to address this need due to its in-memory processing capability. However, one of the challenges is assuring performance of an application before deploying in the production system with increase in data size.

Most of the existing state of the art is on performance analysis of the applications executing on the Spark™ system. Some of them doing performance prediction or auto tuning of analytic workload is using machine learning algorithms. They have used a black box approach while being transparent to underlying the big data system. However, these approaches may fail since each of the big data system has various parameters to configure which can impact performance of the application executing on the system. Performance prediction model accuracy may be improved by including knowledge of underlying system.

The present disclosure proposes a system and method which can meaningfully predict an application performance on the Spark™ platform for higher data size using measurements on low volume data in a small size Spark cluster.

SUMMARY

The following presents a simplified summary of some embodiments of the disclosure in order to provide a basic understanding of the embodiments. This summary is not an extensive overview of the embodiments. It is not intended to identify key/critical elements of the embodiments or to delineate the scope of the embodiments. Its sole purpose is to present some embodiments in a simplified form as a prelude to the more detailed description that is presented below.

In view of the foregoing, an embodiment herein provides a system and method for predicting performance of an application on Spark™ platform in a production environment. In general, the embodiments herein are predicting performance of the application on Spark™ platform for large data and cluster size with different configurations. It facilitates agile development by doing performance testing of application for large data size in development environment before deployment. It can be used to do capacity sizing for a desired performance and hence can assure performance over time with increase in data size.

In one aspect, a method for predicting performance of an application on Spark™ platform in a production environment. The method comprising steps of executing the application with a small size Spark cluster on a small data size of the application, wherein the application is executed as a serial execution of one or more Spark jobs and creates an application log. Further, the process includes parsing of the created application log to collect granular level performance data of the application, estimating an average scheduler delay of each task in the one or more Spark jobs as function of one or more parameters of the Spark™ platform and the small data size of the application using a scheduler delay predictor module, estimating an average execution time of shuffle operation of each task in the one or more Spark jobs as function of parameters of the Spark™ platform and the small data size of the application using a shuffle time predictor module, estimating an average execution time of java virtual machine (JVM) of each task in the one or more Spark jobs as function of parameters of the Spark™ platform and the small data size of the application using an execution time predictor module, simulating stage execution for the one or more Spark jobs for estimating an execution time of the application on a Spark™ platform in the production environment. Finally, the process predicts performance of the application using the estimated average scheduler delay of each task, the estimated average execution time of shuffle operation of each task, the estimated average execution time of JVM overheads of each task, and the estimated execution time of each stage of the one or more Spark jobs.

In another aspect, a system for predicting performance of an application on a Spark™ platform in a production environment. The system comprising a memory with set of instructions and a processor. Further, the system comprises an execution module configured to execute the application with a Spark cluster on small data size of the application, wherein the application is executed as a serial execution of one or more Spark jobs and creates an application log. Furthermore, the system comprises a Spark log parser module configured to parse the created application log to collect granular level performance data of the application, a scheduler delay estimation module configured to estimate an average scheduler delay of each task in the one or more Spark jobs as function of one or more parameters and the data size, a shuffle time estimation module configured to estimate an average execution time of shuffle operation of each task in the one or more Spark jobs as function of one or more parameters and the data size, a JVM execution time estimation module to estimate an average execution time of java virtual machine (JVM) overheads of each task in the one or more Spark jobs as function of one or more parameters and the application, a simulation module configured to simulate for estimating execution time of each stage of the one or more Spark jobs of the application and an estimation module configured to estimate the performance of the application using the estimated average scheduler delay of each task, the estimated average execution time of shuffle operation of each task, the estimated average execution time of JVM overheads of each task, and the estimated execution time of each stage of each Spark job.

It should be appreciated by those skilled in the art that any block diagram herein represents conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and so executed by a computing device or processor, whether or not such computing device or processor is explicitly shown.

BRIEF DESCRIPTION OF THE DRAWINGS

The embodiments herein will be better understood from the following detailed description with reference to the drawings, in which:

FIGS. 2 (a) and (b) is a schematic diagram to illustrate an application execution on the Spark™ platform and tasks execution in an executor for a stage according to an embodiment of the present disclosure;

FIGS. 3 (a) and (b) is a schematic diagram to represent a JVM time estimation for Wordcount and Terasort according to an embodiment of the present disclosure;

DETAILED DESCRIPTION OF EMBODIMENTS

The embodiments herein and the various features and advantageous details thereof are explained more fully with reference to the non-limiting embodiments that are illustrated in the accompanying drawings and detailed in the following description. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Glossary—Terms Used In the Embodiments

The disclosure defines herein a few terms and concepts to understand the disclosure to a person skilled in the art.

| Parameter | Development | Production |
|---|---|---|
| Block Size | $BS_{dev}$ | $BS_{prod}$ |
| Number of Executors | $NE_d$ | $NE_p$ |
| Number of Cores per Executor | $NC_d$ | $NC_p$ |
| Number of jobs in the Application | N | N |
| Number of Stages in Job 'i' | $SN_i$ | $SN_i$ |
| Job 'i' Execution Time | $dJobT_i$ | $pJobT_i$ |
| Job 'i' Start up time | $JobSt_i$ | $JobSt_i$ |
| Job 'i' Clean up time | $JobCln_i$ | $JobCln_i$ |
| Job 'i' Stage'j' Execution time | $dStageT_i^j$ | $pStageT_i^j$ |
| Job 'i' Stage'j' Startup time | $StgSt_i^j$ | $StgSt_i^j$ |
| Job 'i' Stage'j' Cleanup time | $StgCln_i^j$ | $StgCln_i^j$ |
| Job 'i', Stage 'j', Number of tasks | $dNT_i^j$ | $pNT_i^j$ |
| Job 'i', Stage 'j, Size of Shuffled Data | $dDS_i^j$ | $pDS_i^j$ |
| Job 'i', Stage 'j', Task Execution Time | $dTskT_i^j$ | $pTskT_i^j$ |
| Job 'i', Stage 'j', Task Execution Time in 'k'th wave | $dTsKT_i^{jk}$ | $pTskT_i^{jk}$ |
| Job 'i', Stage 'j', Task Serialization + De-serialization Time | $dTskSer_i^j$ | $pTskSer_i^j$ |
| Job 'i', Stage 'j', Task JVM Time | $dTskJvm_i^j$ | $pTskJvm_i^j$ |
| Job 'i', Stage 'j', Task Shuffle IO Time | $dTskSf_i^j$ | $pTskSf_i^j$ |
| Job 'i', Stage 'j', Task Scheduler Delay | $dTskSd_i^j$ | $pTskSd_i^j$ |
| Job 'i', Stage 'j', First Wave Task Compute Time | $dFstTskCt_i^j$ | $pFstTskCt_i^j$ |
| Job 'i', Stage 'j', First Wave Task Scheduler Delay | $dFstTskSd_i^j$ | $pFstTskSd_i^j$ |
| Job 'i', Stage 'j', Rest Wave 'k'th bucket duration | $dRstTkBktDur_i^{jk}$ | $pRstTkBktDur_i^{jk}$ |
| Job 'i', Stage 'j', Number of Rest Wave tasks in 'k'th bucket | $dRstTkBktN_i^{jk}$ | $pRstTskBktN_i^{jk}$ |
| Job 'i', Stage 'j', Rest Wave Task Compute Time | $dRstTskCt_i^j$ | $pRstTskCt_i^j$ |
| Job 'i', Stage 'j', Rest Wave Task Scheduler Delay | $dRstTskSd_i^j$ | $pRstTskSd_i^j$ |
| Job 'i', Stage 'j', Rest Wave Task Maximum Compute Time | $dRstTkMaxCT_i^j$ | — |
| Job 'i', Stage 'j', Rest Wave Task Minimum Compute Time | $dRstTkMinCT_i^j$ | — |

Figure 1:
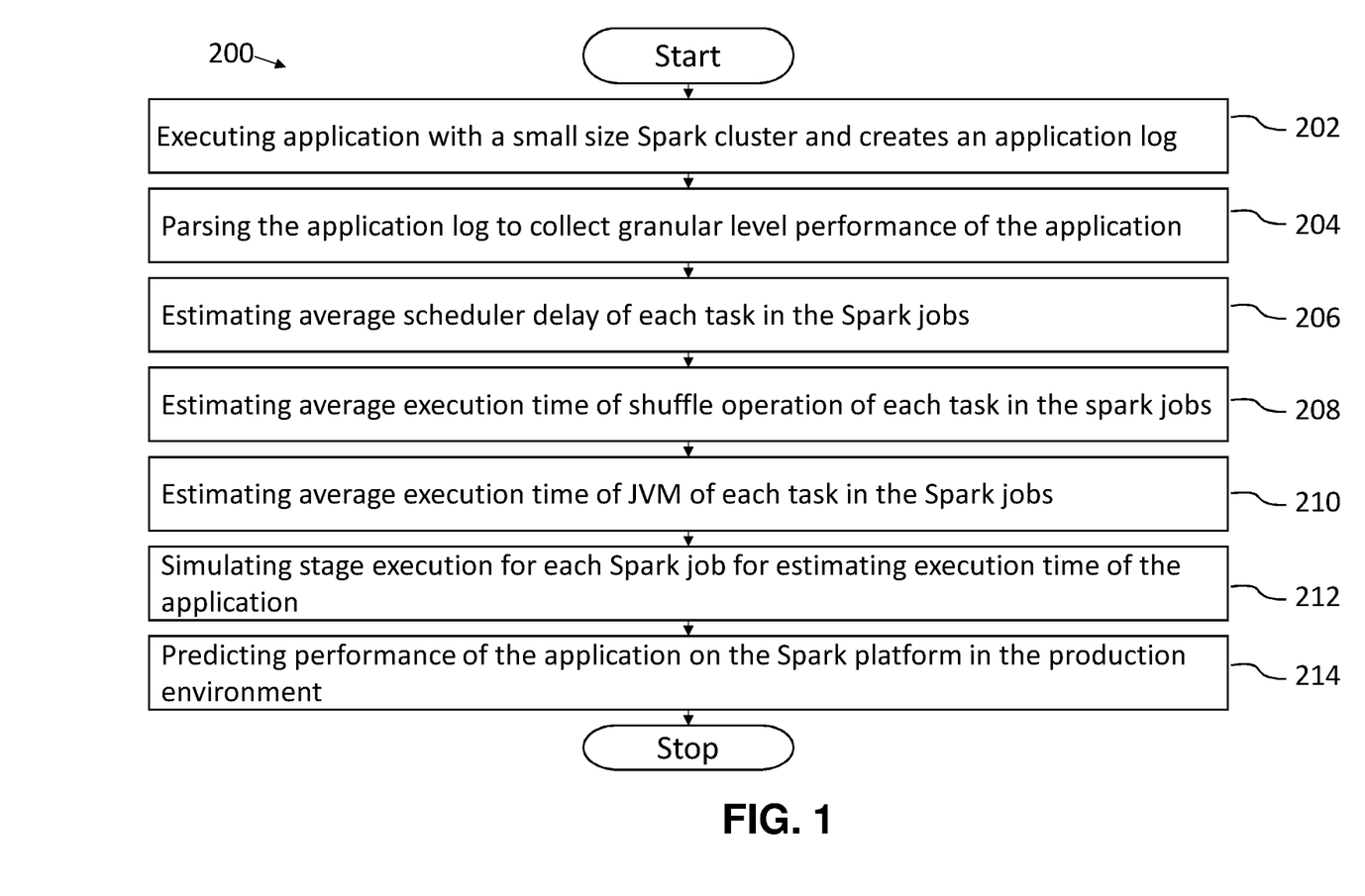
FIG. 1 illustrates a method for predicting performance of an application on a Spark™ platform in a production environment according to an embodiment of the present disclosure.

Referring FIG. 1, a method 200 for predicting performance of an application on a Spark™ platform in a production environment, wherein the Spark™ platform is a widely deployed commodity based parallel processing framework.

At the step 202, where the process executes the application with a small size Spark cluster on a small data size of the application. It would be appreciated that the small data size of the application means an application representative dataset available in testing/development environment. Further, it is to be noted that the cluster is assumed to have at least one instance of each type of heterogeneous nodes available in the production cluster. The application is executed as a serial execution of one or more Spark jobs in the cluster of small data size of the application on the Spark™ platform. The task execution time includes a scheduler delay, a serialization time, a de-serialization time, a JVM overheads, a compute time (including IO read/write time in HDFS) and a shuffle IO time. Therefore, the predicted execution time of the application is summation of the estimated execution time of each Spark job of the one or more Spark jobs. Further, it should be noted that the Spark™ platform creates an application log to have granular level of performance data or execution details of the application within the framework.

Figure 2A:
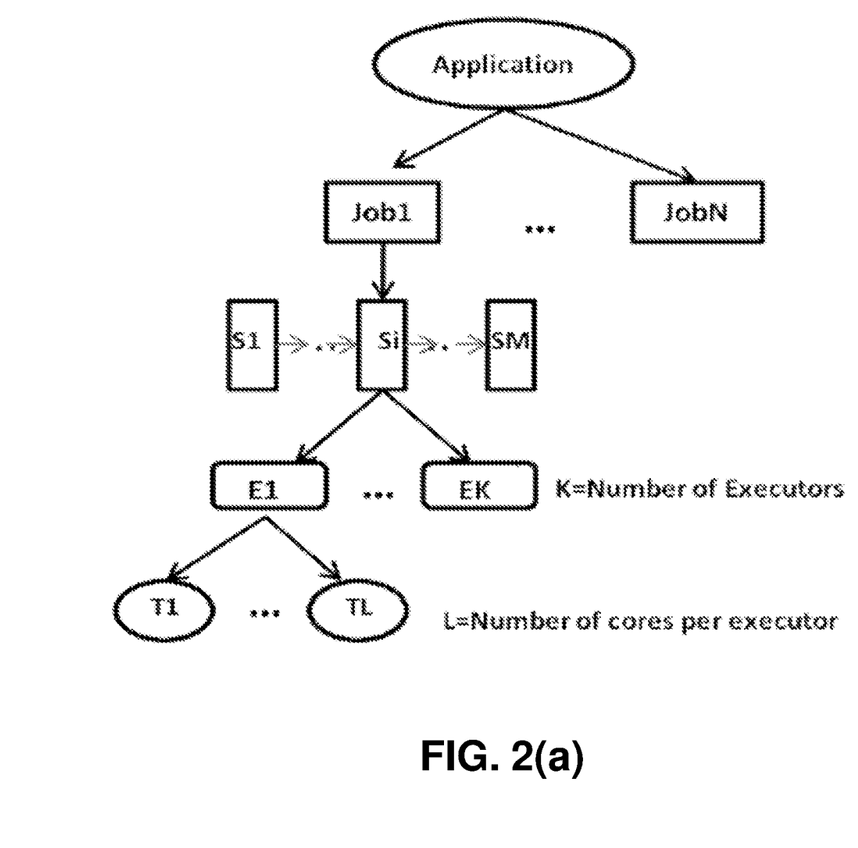
Figure 2B:
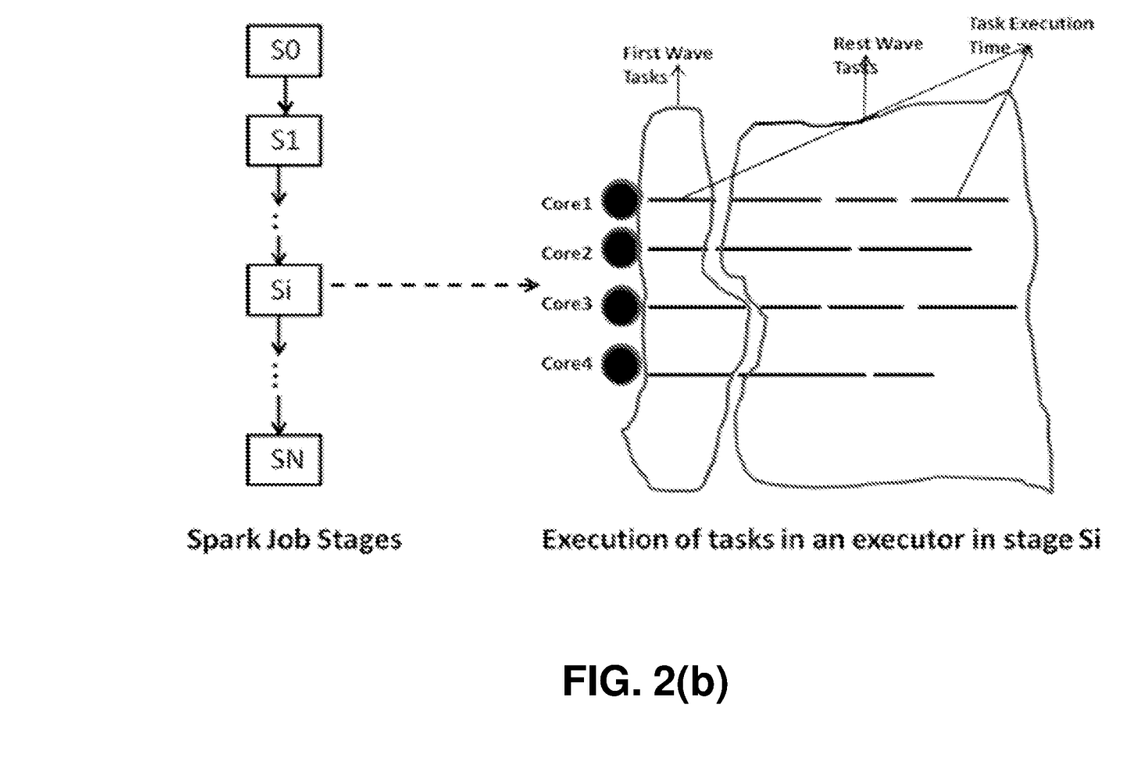

Referring FIGS. 2(a) and (b), wherein each Spark job is executed in a form of directed acyclic graph (DAG) and wherein each node in the directed acyclic graph represents a stage. Each stage is executed as a set of concurrent executors with parallel tasks in each executor. The execution at each stage depends on values of number of executors and number of cores per executors' parameters. Further, it is to be noted that for each task of the one or more Spark jobs in the same executor shares the same JVM memory. Each task of the one or more Spark jobs processes a defined size of data set and for a given data size, an executor may have multiple waves of such parallel tasks execution on each core. Since, all tasks in a stage are identical and read same data size, therefore for job 'V stage j' its execution time may be estimated as $$pStageT_i^j = StageSt_i^j + Avg(pTskT_i^j) * \left\lceil \frac{pDS_i^j}{(BS_p * NE_p * NC_p)} \right\rceil + StageClr_i^j$$

where $pStageT_i^j$ is production execution time for job 'V at stage j'. However, variation in tasks' execution time may break the symmetry and number of tasks assigned per core may not be same at all cores. Variation is tasks' execution time could be due to data skew, heterogeneous nodes and variability in location of HDFS block(s) read by a task-local, same rack or remote.

At the step 204, where the process parses the created application log to collect granular level performance data of the application. It would be appreciated that a small data size of the application is executed with a small cluster of the Spark™ platform. Therefore, the application log created during the execution is parsed to collect finer level details of execution of the application within the framework which are extrapolated and used in the performance prediction.

At the step 206, where the process estimates an average scheduler delay of each task in the one or more Spark jobs as function of one or more predefined parameters of the Spark™ platform and the small data size of the application. The scheduler delay is the delay incurred while scheduling a task. The Spark™ platform consists multiple parameters to configure, which can impact the application execution time for varying data cluster sizes. Thus, it should be noted herein that the one or more predefined parameters of the Spark™ platform are identified which can impact the application execution time for varying data sizes. The predefined one or more parameters of the Spark™ platform include a number of executors, a number of cores per executors and an executor memory size. The executors' memory size controls both shuffle operation time and JVM heap size. In addition to this, these one or more predefined parameters are configurable and could be changed during the application execution.

In one embodiment, if all stage tasks of the one or more Spark jobs are divided into two types of tasks such as first wave tasks and rest wave tasks by emulating the task scheduling behaviour of the Spark™ platform across cores. For both the first wave tasks and rest wave tasks, a task scheduler delay is observed to be in proportion to the number of tasks to be allocated in respective waves, such as, $$pFstTskSd_i^j = dFstTskSd_i^j * \frac{pNT_i^j}{dNT_i^j}$$

-continued
$$pRstTskSd_i^j = dRstTskSd_i^j$$

where $pFstTskSd_i^j$ denotes first wave task compute time on production for job 'V stage j', $dFstTskSd_i^j$ denotes first wave task compute time on development for job 'V stage j', $pRstTskSd_i^j$ denotes rest wave task schedule delay on production for job 'V stage j', and $dRstTskSd_i^j$ denotes rest wave task schedule delay on development for job 'V stage j'.

At the step 208, where the process estimates an average execution time of the shuffle operation of each task in the Spark job as function of one or more predefined parameters of the Spark™ platform and the small data size of the application using a shuffle time predictor module. The shuffle data size in memory is increases due to de-serialization. It is to be noted that the estimation of the task shuffle operation is a linear extrapolation approach, but it may hold true only for those configurations of production system where task's shuffle data size is small enough to fit in the allocated memory. Otherwise, shuffle operation leads to spill over to disk and incurs extra disk IO read/write operations for the task. Herein, the process estimates the shuffle data size per task and predicts if this will lead to spill over. If it does, the process estimates the overhead of spill over and it adds that to the tasks' shuffle operation time.

In one embodiment, wherein if the data size increases more than the allocated shuffle memory, the shuffle operation will spill over to disk for the executors tasks. Let $OpS_i^j$ is the largest shuffle data size per executor which fits into the allocated shuffle memory after serialization and does not spill over to the disk, then for measured spill overheads, where the shuffle data per executor is more than the optimal size, as spill per task in the development environment, $$pTskSf_i^j = \frac{\sum_{\forall tasks} dTskSf_i^j}{dNT_i^j} * \frac{pDS_i^j}{dDS_i^j} + \left(\frac{pDS_i^j}{NE_p} - OptS_i^j\right) * \text{Spill}$$

where $pDS_i^j = dDS_i^j *$ Production Size/Development Size, $pTskSj_i^j$ denotes the task shuffle IO time on production for job 'V stage j', $dTskSj_i^j$ denotes the task shuffle IO time on development for job 'V stage j', $dNT_i^j$ denotes number of tasks on development for job 'V stage j', $dDS_i^j$ denotes shuffle data on development for job 'V stage j', $pDS_i^j$ denotes shuffle data on production for job 'V stage j' and $NE_p$ denotes number of executors.

At the step 210, where the process estimates an average execution time of java virtual machine (JVM) of each task in the Spark job as function of the one or more predefined parameters of the Spark™ platform and the small data size of the application using an execution time predictor module.

Figure 3A:
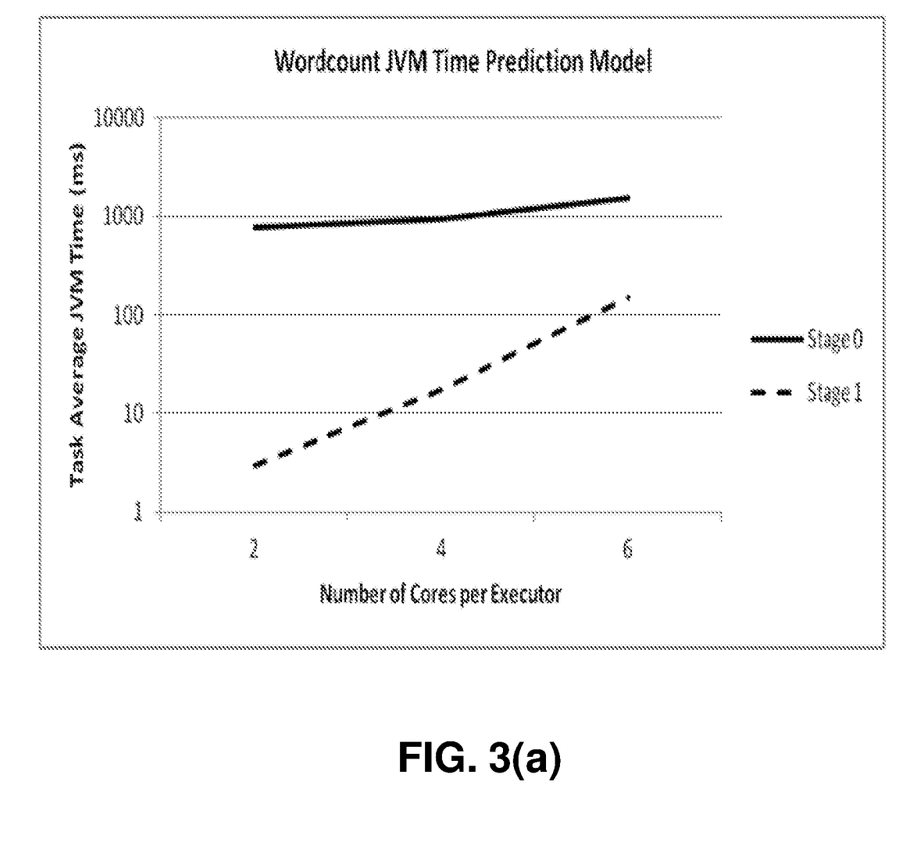
Figure 3B:
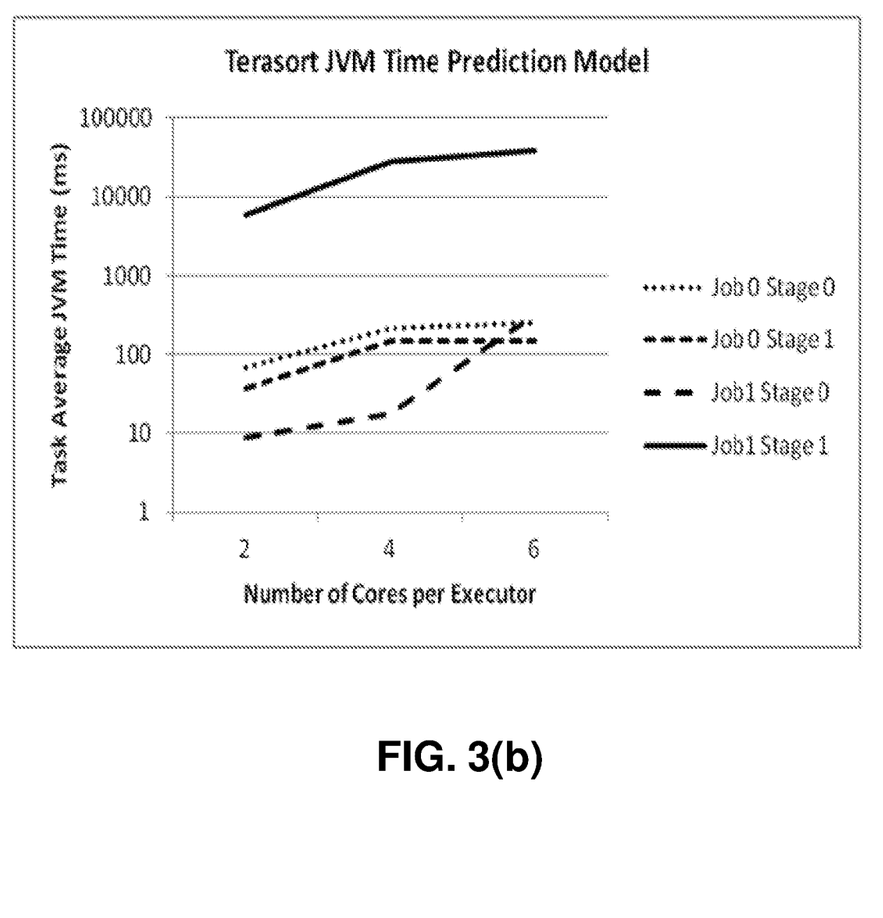

In one embodiment, if on the Spark™ platform, each executor has single JVM and all tasks scheduled in it share the same JVM, then JVM overheads increases with increase in the number of concurrent tasks (threads) accessing the same JVM which is controlled by number of cores per executor parameter. It is to be noted that the JVM overheads increases linearly with number of executors scheduled concurrently on the same machine. These overheads are system and application dependent, hence they modelled JVM overheads as function of number of cores per executor by taking average of measured task JVM time. The measurements are taken by varying number of cores per executor and keeping only one executor per machine. Referring FIGS. 3 (a) and (b), wherein it illustrates that for more number of executors per machine in the production environment, the task JVM time is further extrapolated linearly to the number of executors per node.

At the step 212, where the process simulates stage execution for each Spark job for estimating an execution time of the application on a Spark™ platform in the production environment. It allows prediction for environments having data skew, heterogeneous nodes or any other task execution variability. The execution time includes scheduler delay, serialization time, de-serialization time, JVM overheads, IO read/write time in HDFS and shuffle IO read/write time. It is to be noted that the each task of the one or more Spark jobs reads either shuffled data or input data and writes shuffled data or output data. Therefore the execution time of the task in stage of each one or more Spark jobs is estimated as:

$$pTskT_i^j = pTskSd_i^j + pTskSer_i^j + pTskCt_i^j + pTskJvm_i^j + pTskSf_i^j$$

At the last step 214, where the process predicts the performance of the application using the estimated average scheduler delay of each task, the estimated average execution time of shuffle operation of each task, the estimated average execution time of JVM of each task, and the estimated execution time of each stage of each Spark job.

Figure 4:
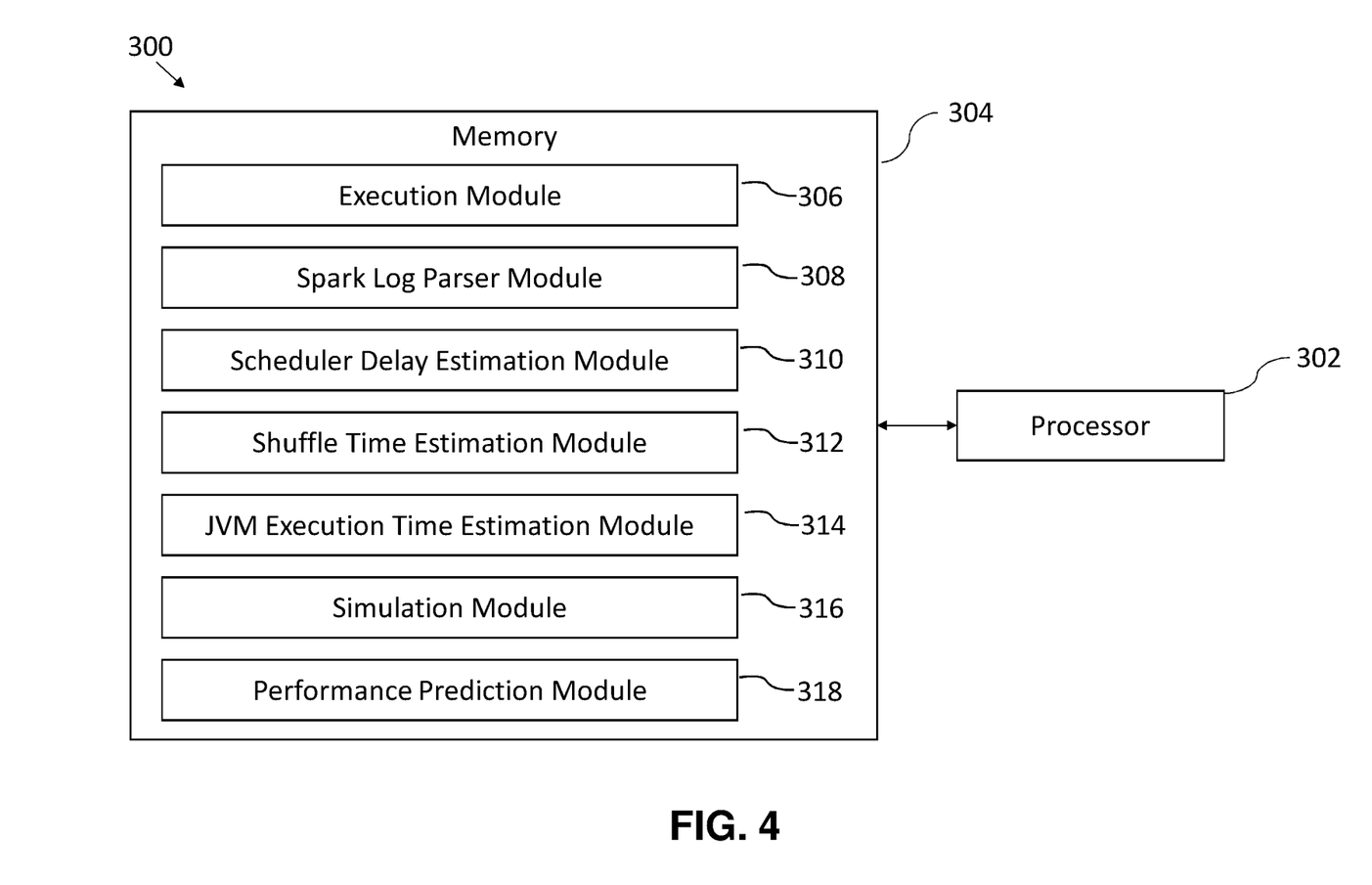
FIG. 4 illustrates a system for predicting performance of an application on a Spark™ platform in a production environment according to an embodiment of the present disclosure.

Referring FIG. 4, a system 300 for predicting performance of an application on a Spark™ platform in a production environment. The Spark™ platform is a widely deployed commodity based parallel processing framework. The system 300 comprising a processor 302, a memory 304 communicatively coupled to the processor 302, an execution module 306, a Spark log parser module 308, a scheduler delay estimation module 310, a shuffle time estimation module 312, a JVM execution time estimation module 314, a simulation module 316, and a performance prediction module 318.

In the preferred embodiment, the execution module 306 of the system 300 is configured to execute the application with a small size Spark cluster on a small data size of the application. It is to be noted that the cluster is assumed to have atleast one instance of each type of heterogeneous nodes available in the production cluster. The application is executed as a serial execution of one or more Spark jobs and creates an application log. Herein, each Spark job is executed in the form of directed acyclic graph (DAG) and each node in the directed acyclic graph represents a stage. Further, the each stage is executed as a set of concurrent executors with parallel tasks in each executor and the execution at each stage depends on the values of number of executors and the number of cores per executors' parameters.

In the preferred embodiment, the Spark log parser module 308 of the system 300 is configured to parse the created application log to collect granular level performance data of the application. It would be appreciated that a small data size of the application is executed on small cluster of Spark™ platform. Therefore, the application log created during the execution is parsed to collect granular level performance data or details of execution of the application within the framework. Further, the parsed details of the execution of the application are extrapolated and used in the performance prediction.

In the preferred embodiment, the scheduler delay estimation module 310 of the system 300 is configured to estimate an average scheduler delay of each task in the one or more Spark jobs as function of one or more predefined parameters and the data size of the Spark™ platform. The scheduler delay is the delay incurred while scheduling a task.

In the preferred embodiment, the shuffle time estimation module 312 of the system 300 is configured to estimate an average execution time of shuffle operation of each task in the one or more Spark jobs as function of one or more predefined parameters and the data size. The shuffle data size in memory is increases due to de-serialization. It is to be noted that the task shuffle estimation is a linear extrapolation approach, but it may hold true only for those configurations of the production system where the task's shuffle data size is small enough to fit in the allocated memory. Otherwise, the shuffle operation leads to spill over to disk and incurs extra disk IO read/write operations for the task. Herein, the process estimates the shuffle data size per task and predicts if this will lead to spill over. If it does, the process estimates the overhead of spill over and it adds that to the tasks shuffle time. Usually, spill overheads are calculated at small data size by constraining the system to generate spurious disk spills.

In the preferred embodiment, the JVM execution time prediction module 314 is configured to estimate an average execution time of java virtual machine (JVM) of each task in the one or more Spark jobs as function of one or more predefined parameters and the application. In general, if on the Spark™ platform, each executor has single JVM and all tasks scheduled in it share the same JVM, then JVM overheads increases with increase in the number of concurrent tasks (threads) accessing the same JVM which is controlled by number of cores per executor parameter.

In the preferred embodiment, the simulation module 316 of the system 300 is configured to simulate for estimating an execution time of each stage of the one or more Spark jobs of the application. It allows prediction for environments having data skew, heterogeneous nodes or any other task execution variability. The execution time includes the scheduler delay, the serialization time, the de-serialization time, the JVM overheads, IO read/write time in HDFS and shuffle IO read/write time.

In the preferred embodiment, the performance prediction module 318 of the system 300 is configured to predict performance of the application using the estimated average scheduler delay of each task, the estimated average execution time of shuffle operation of each task, the estimated average execution time of JVM of each task, and the estimated execution time of each stage of the one or more Spark jobs.

In one embodiment, the performance prediction module 318 can be used iteratively in an optimization algorithm to get the predefined parameters' values for an optimal performance on a given cluster and the data size. It is to be noted that the one or more predefined parameters of the Spark™ platform, which can impact the application execution time for varying data cluster sizes, are considered for tuning of the application execution on the Spark™ platform.

Figure 5:
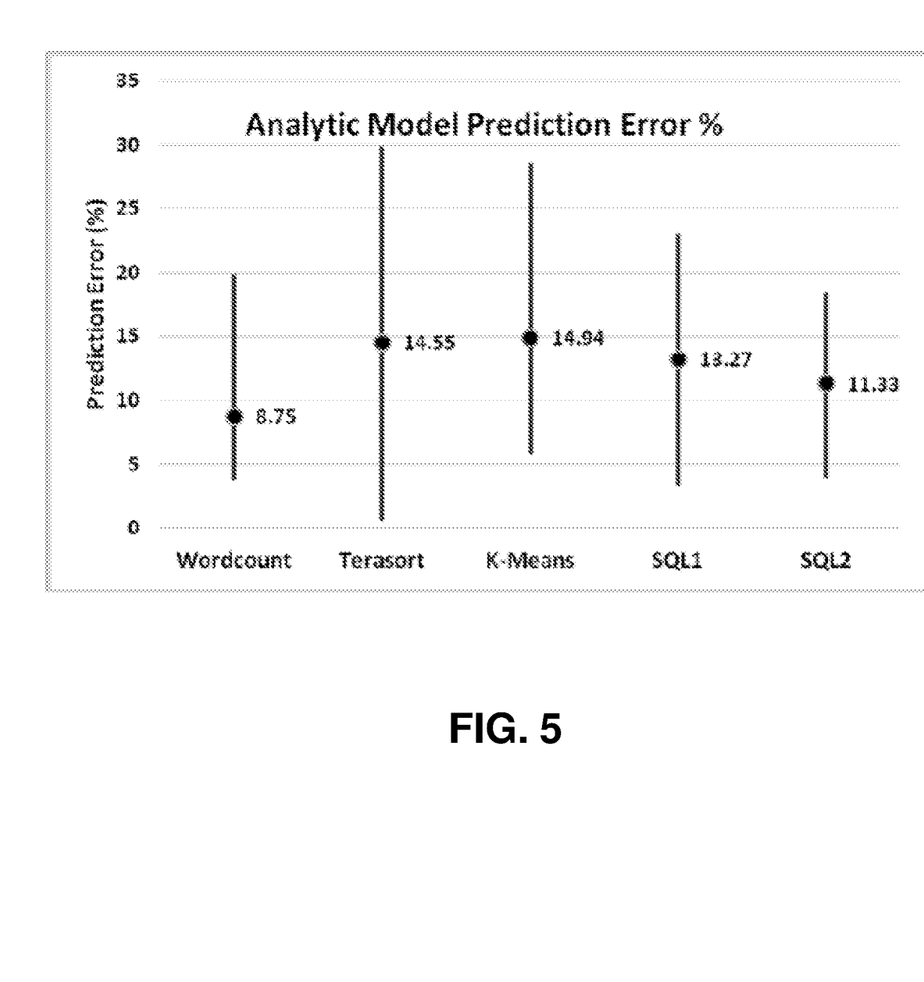
FIG. 5 is a schematic diagram to illustrate the performance prediction error for each application according to an embodiment of the present disclosure.

Referring FIG. 5, as an example, wherein an average performance prediction error is shown to validate the performance of prediction model with around 15 production configurations for each of the workloads. The prediction error is calculated as the ration of the absolute difference in the actual execution time and the model's estimated execution time, to the actual execution time. It shows an average 15% prediction error for each application with maximum 30% error. In this, the wordcount application has only one job with two stages. It is a simple map reduce application, where the proposed model's estimation are very close to the actual execution time. It shows an average accuracy of 91% as shown in FIG. 5. A Terasort is a sorting application with two jobs and two stages in each job and for most of the test cases it shows accuracy of atleast 80%. Further, a K-means application which has around 20 jobs, each job with 2 stages and herein, it shows accuracy of 85%. Further, it considers two SQL queries based on TPC-H, wherein SQL1 query is more like an aggregation which has one job with two stages and SQL2 query has one aggregate and one join operation which is executed as one job with four stages. The estimated values for both SQL queries to the actual value with accuracy of 90%.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

A system and method for predicting performance of an application with Spark™ platform in a production environment. The application on Spark™ platform is executed as a sequence of Spark jobs. Each Spark job is executed as a directed acyclic graph (DAG) consisting of stages. Each stage has multiple executors running in parallel and the each executor has set of concurrent tasks. Each executor spawns multiple threads, one for each task. All jobs in the same executor share the same JVM memory. The execution time for each Spark job is predicted as summation of the estimated execution time of all its stages. The execution time constitutes scheduler delay, serialization time, de-serialization time, and JVM overheads. The JVM time estimation depends on type of computation hardware system and number of threads.

The embodiments of present disclosure herein addresses unresolved problem to predict performance of an application on a Spark™ platform in a production environment. Most of the existing state of the art is on performance analysis of applications executing on Spark™ system. Some of them doing performance prediction or auto tuning of analytic workload is using machine learning algorithms. They have used black box approach while being transparent to underlying big data system. However, these approaches may fail since each of big data system has various parameters to configure which can impact performance of application executing on Spark™ system. Some of them doing performance prediction or auto tuning of analytic workload is using machine learning algorithms. They have used black box approach while being transparent to underlying big data system. However, these approaches may fail since each of big data system has various parameters to configure which can impact performance of application executing on the system. Performance prediction model accuracy may be improved by including knowledge of underlying system.

It is, however to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof.

The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software modules located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

A representative hardware environment for practicing the embodiments may include a hardware configuration of an information handling/computer system in accordance with the embodiments herein. The system herein comprises at least one processor or central processing unit (CPU). The CPUs are interconnected via system bus to various devices such as a random access memory (RAM), read-only memory (ROM), and an input/output (I/O) adapter. The I/O adapter can connect to peripheral devices, such as disk units and tape drives, or other program storage devices that are readable by the system. The system can read the inventive instructions on the program storage devices and follow these instructions to execute the methodology of the embodiments herein.

The system further includes a user interface adapter that connects a keyboard, mouse, speaker, microphone, and/or other user interface devices such as a touch screen device (not shown) to the bus to gather user input. Additionally, a communication adapter connects the bus to a data processing network, and a display adapter connects the bus to a display device which may be embodied as an output device such as a monitor, printer, or transmitter, for example.

The preceding description has been presented with reference to various embodiments. Persons having ordinary skill in the art and technology to which this application pertains will appreciate that alterations and changes in the described structures and methods of operation can be practiced without meaningfully departing from the principle, spirit and scope.

What is claimed is:

1. A method for predicting performance of an application on a big data platform in a production environment, wherein the method comprising:

executing the application in a cluster of small data size of the application, wherein the application is executed as a serial execution of one or more jobs and creates an application log, wherein the small data size of the application means an application representative dataset available in a development environment;

parsing the created application log to collect granular level performance data of the application using a log parser module, wherein the collected granular level performance data of the application are extrapolated and used in predicting performance of the application, and wherein granular level performance data of the application comprise details of execution of the application on the big platform;

estimating an average scheduler delay of each task in the one or more jobs as a function of one or more predefined parameters of the big data platform and the data size of the application on the big data platform using a scheduler delay estimation module, wherein the one or more predefined parameters of the big data platform include number of executors, number of cores per executor, and executor memory size;

estimating an average execution time of a shuffle operation of each task in the one or more jobs as a function of the one or more predefined parameters of the big data platform and the data size of the application on the big data platform using a shuffle time estimation module, wherein estimating the average execution time of the shuffle operation comprises: estimating shuffle data size per task and predicting if the shuffle operation with the estimated shuffle data size per task leads to spill over to disk, and wherein if the shuffle operation leads to the spill over to the disk, estimating overhead of the spill over and adding the overhead to shuffle operation time of the task;

estimating an average execution time of java virtual machine (JVM) overheads of each task in the one or more jobs as a function of the one or more predefined parameters of the big data platform and the data size of the application using a JVM execution time estimation module;

simulating stage execution for each job of the one or more jobs for estimating an execution time of each stage of each job in the application execution on the big data platform in the production environment, wherein each stage is executed as a set of concurrent executors with parallel tasks in each executor, wherein the execution at each stage depends on values of the number of executors, the number of cores per executors' parameters and the executor memory size, wherein the each executor include a single JVM memory and each task of the one or more jobs in the same executor shares the same single JVM memory; and predicting performance of the application using the estimated average scheduler delay of each task, the estimated average execution time of the shuffle operation of each task, the estimated average execution time of JVM overheads of each task, and the estimated execution time of each stage of each job in the application on the big data platform in the production environment.

2. The method claimed in claim 1, wherein each job of the one or more jobs is executed in the form of directed acyclic graph (DAG), wherein each node in the directed acyclic graph represents a stage.

3. A system for predicting performance of an application on a big data platform in a production environment, wherein the system comprising:

a memory with a plurality of instructions;

a processor is communicatively coupled with the memory;

an execution module configured to execute the application in a cluster of small data size of the application, wherein the application is executed as a serial execution of one or more jobs and creates an application log, wherein the small data size of the application means an application representative dataset available in a development environment;

a log parser module configured to parse the created application log to collect granular level performance data of the application, wherein the collected granular level performance data of the application are extrapolated and used in predicting performance of the application, and wherein granular level performance data of the application comprise details of execution of the application on the big platform;

a scheduler delay estimation module configured to estimate an average scheduler delay of each task in the one or more jobs as a function of one or more predefined parameters of the big data platform and the data size of the application, wherein the one or more predefined parameters of the big data platform include number of executors, number of cores per executor, and executor memory size;

a shuffle time estimation module configured to estimate an average execution time of a shuffle operation of each task in the one or more jobs as a function of the one or more predefined parameters of the big data platform and the data size of the application, wherein the shuffle time estimation module estimates shuffle data size per task and predicts if the shuffle operation with the estimated shuffle data size per task leads to spill over to disk, and wherein if the shuffle operation leads to the spill over to the disk, the shuffle time estimation module estimates overhead of the spill over and adds the overhead to shuffle operation time of the task;

a JVM execution time estimation module to estimate an average execution time of java virtual machine (JVM) overheads of each task in the one or more jobs as a function of the one or more predefined parameters of the big data platform and the data size of the application;

a simulation module configured to simulate stage execution for each job of one or more jobs for estimating an execution time of each stage of each job of the one or more jobs of the application, wherein each stage is executed as a set of concurrent executors with parallel tasks in each executor, wherein the execution at each stage depends on values of the number of executors, the number of cores per executors' parameters and the executor memory size, wherein the each executor include a single JVM memory and each task of the one or more jobs in the same executor shares the same single JVM memory; and a performance prediction module configured to predict the performance of the application using the estimated average scheduler delay of each task, the estimated average execution time of the shuffle operation of each task, the estimated average execution time of JVM of each task, and the estimated execution time of each stage of each job of the one or more jobs in the application on the big data platform in the production environment wherein the execution module, the log parser module, the scheduler delay estimation module, the shuffle time estimation module, the JVM execution time estimation module, the simulation module, and the performance prediction module are implemented by the processor executing the plurality of instructions.

4. The system claimed in claim 3, wherein each job is executed in the form of directed acyclic graph (DAG), wherein each node in the directed acyclic graph represents a stage.

5. A non-transitory computer readable medium storing one or more instructions which when executed by a processor on a system, cause the processor to perform a method for predicting performance of an application on a big data platform in a production environment comprising:

executing the application in a cluster of small data size of the application, wherein the application is executed as a serial execution of one or more jobs and creates an application log, wherein the small data size of the application means an application representative dataset available in a development environment;

parsing the created application log to collect granular level performance data of the application using a log parser module, wherein the collected granular level performance data of the application are extrapolated and used in predicting performance of the application, and wherein granular level performance data of the application comprise details of execution of the application on the big platform;

estimating an average scheduler delay of each task in the one or more jobs as a function of one or more pre-defined parameters of the big data platform and the data size of the application on the big data platform using a scheduler delay estimation module, wherein the one or more predefined parameters of the big data platform include number of executors, number of cores per executor, and executor memory size;

estimating an average execution time of a shuffle operation of each task in the one or more jobs as a function of the one or more predefined parameters of the big data platform and the data size of the application on the big data platform using a shuffle time estimation module, wherein estimating the average execution time of the shuffle operation comprises: estimating shuffle data size per task and predicting if the shuffle operation with the estimated shuffle data size per task leads to spill over to disk, and wherein if the shuffle operation leads to the spill over to the disk, estimating overhead of the spill over and adding the overhead to shuffle operation time of the task;

estimating an average execution time of java virtual machine (JVM) overheads of each task in the one or more jobs as a function of the one or more predefined parameters of the big data platform and the data size of the application using a JVM execution time estimation module;

simulating stage execution for each job of the one or more jobs for estimating an execution time of each stage of each job in the application execution on the big data platform in the production environment, wherein each stage is executed as a set of concurrent executors with parallel tasks in each executor, wherein the execution at each stage depends on values of the number of executors, the number of cores per executors' parameters and the executor memory size, wherein the each executor include a single JVM memory and each task of the one or more jobs in the same executor shares the same single JVM memory; and predicting performance of the application using the estimated average scheduler delay of each task, the estimated average execution time of the shuffle operation of each task, the estimated average execution time of JVM overheads of each task, and the estimated execution time of each stage of each job in the application on the big data platform in the production environment.

* * * * *